(12) United States Patent
Vinson et al.

(10) Patent No.: US 8,655,501 B2
(45) Date of Patent: Feb. 18, 2014

(54) COOLING ASSIST MODULE

(75) Inventors: Wade D. Vinson, Magnolia, TX (US);
Robert B. Curtis, Allen, TX (US);
David W. Sherrod, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 371 days.

(21) Appl. No.: 12/540,479

(22) Filed: Aug. 13, 2009

(65) Prior Publication Data
US 2009/0306833 A1    Dec. 10, 2009

Related U.S. Application Data

(63) Continuation of application No. 11/038,723, filed on Jan. 19, 2005, now Pat. No. 7,599,761.

(51) Int. Cl.
*G05D 23/00*    (2006.01)

(52) U.S. Cl.
USPC ............ 700/300; 700/299; 361/689; 257/714

(58) Field of Classification Search
USPC .......... 700/299–300; 361/688–689, 691, 696, 361/698–699; 174/15.1; 257/712–714
See application file for complete search history.

(56) References Cited

U.S. PATENT DOCUMENTS

| | | | | |
|---|---|---|---|---|
| 5,963,887 A * | 10/1999 | Giorgio | ............................ | 702/64 |
| 6,752,201 B2 * | 6/2004 | Cipolla et al. | ................ | 165/121 |
| 7,011,143 B2 * | 3/2006 | Corrado et al. | ............... | 165/80.4 |
| 2003/0156385 A1 * | 8/2003 | Askeland et al. | ............. | 361/687 |
| 2004/0221603 A1 * | 11/2004 | Arik et al. | ................... | 62/259.2 |
| 2005/0083657 A1 * | 4/2005 | Hamman | ...................... | 361/699 |
| 2005/0225936 A1 * | 10/2005 | Day | ............................ | 361/687 |
| 2006/0002080 A1 * | 1/2006 | Leija et al. | .................... | 361/687 |
| 2006/0067047 A1 * | 3/2006 | Pfahnl | ............................ | 361/687 |
| 2006/0249279 A1 * | 11/2006 | Chordia et al. | ............... | 165/80.4 |

OTHER PUBLICATIONS

C.J Mulanix Company Inc. Brazepak model BP410 series specification page. (http://www.cjmulanixco.com/Brazepak/BP-410_Series.php).*
Leander Kahney, "How Computer Chips Keep Cool", Oct. 8, 2003, Wired Magazine. http://www.wired.com/science/discoveries/news/2003/10/60733.*

* cited by examiner

*Primary Examiner* — Mohammad Ali
*Assistant Examiner* — Nathan Laughlin

(57) ABSTRACT

Systems associated with moving heat out of a computer are described. One exemplary system embodiment includes a large heat exchanger, large, quiet, automatically redundant fans, automatically redundant pumps, and a leak containment apparatus. The example system may also include logics for selectively controlling air flow, liquid flow, and flow paths.

16 Claims, 6 Drawing Sheets

COOLING ASSIST MODULE

CROSS-REFERENCE TO RELATED APPLICATIONS

This is a continuation of U.S. patent application Ser. No. 11/038,723, entitled "COOLING ASSIST MODULE," filed Jan. 19, 2005 now U.S. Pat. No. 7,599,761, by Vinson et al., and assigned to the present assignee.

BACKGROUND

Computers, servers, rack mounted systems and so on may be too hot, too noisy, and consume too much space. In servers, particularly in rack mounted systems, heat related problems continue to grow. Since the number of transistors in an integrated circuit continues to double approximately every eighteen months, ever more computing power is being crowded into ever smaller spaces. While chips have gotten smaller and more dense, both their power requirements and resulting heat production have increased. Furthermore, this additional heat is being produced in more confined spaces (e.g., rack mounted systems). Thus, not only are computers getting hotter but heat density (e.g., heat generated per volume of space) is increasing and escape routes for that heat continue to shrink and/or become blocked.

As has been described in many patents, published patent applications, advertisements, articles and so on, conventional heat sinks in conventional cooling designs simply cannot accommodate these increasing heat densities. Therefore, recent attempts to remove heat from a computer have included using larger heat sinks, retrofitting computers with heat pipes, soldering fans onto hot chips, integrating fans into heat sinks, and so on. But larger heats sinks use more space, in some cases an unacceptable amount of space. Also, larger heat sinks may still not provide enough cooling. Similarly, fans use power, consume space, and produce noise. Small fans configured to move enough air to provide significant cooling tend to be noisy. Also, there is a space-imposed limit as to how many heat sinks, fans, and so on that can be added to some computing configurations like 1 U form factor units. Additionally, paths for moving ambient air may be restricted. Thus, most conventional air-cooling solutions have not achieved desired cooling and have negatively impacted component density.

Therefore, some systems have taken a liquid cooled approach. Liquid cooled systems are becoming more popular because liquid can absorb and dissipate approximately one thousand times more heat than conventional air cooling systems. In one example, a facilities chilled liquid delivery system has been built into a rack mount. Other rack mounted systems have reserved several rack spaces for a two-phase liquid refrigerant based sub-cooling element that can provide chilled liquid to units in a rack. However, these sub-cooling elements are typically two-phase liquid refrigerant based and thus expensive, noisy, difficult to service, environmentally unfriendly, unintelligent, and generally not redundant. Furthermore, they have typically required rack mounted server components (e.g., 1 U form factor components) to be re-engineered to interface with the new rack design, its fluid connectors, and so on. Additionally, refrigerant based systems have experienced condensation problems in server systems, particularly rack mounted systems, and may have environmental concerns associated with leaking refrigerants. These refrigerant based systems typically include a compressor and have therefore required copper or other substantially rigid piping to convey chilled fluid from place to place at pressures at and above 100 psi (pounds per square inch). Rigid, high-pressure piping can constrain system design and thus limit ad-hoc cooling reconfigurations.

One example add-in liquid cooled system is configured to fit in a 5.25 inch drive bay. The portion of the system housed in the 5.25 inch bay provides cooled liquid to a cold plate that is soldered or clamped onto a component (e.g., processor) that a user wishes to cool. Another example add-in liquid cooled system is configured to occupy several shelves in a rack. The portion of the system housed in the shelves provides a chilled two-phase liquid refrigerant to rigid tubing that can be fixed to liquid cooled components like a cold plate soldered onto a processor. These rigid refrigerant based systems can typically be described as having an evaporate cold plate that includes an evaporative flow path for directing a refrigerant through the cold plate that is in heat exchange relation with the electronic components to be cooled. For at least the reasons described above, these systems may not provide adequate cooling solutions.

BRIEF DESCRIPTION OF THE DRAWINGS

The accompanying drawings, which are incorporated in and constitute a part of the specification, illustrate various example system embodiments of various aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
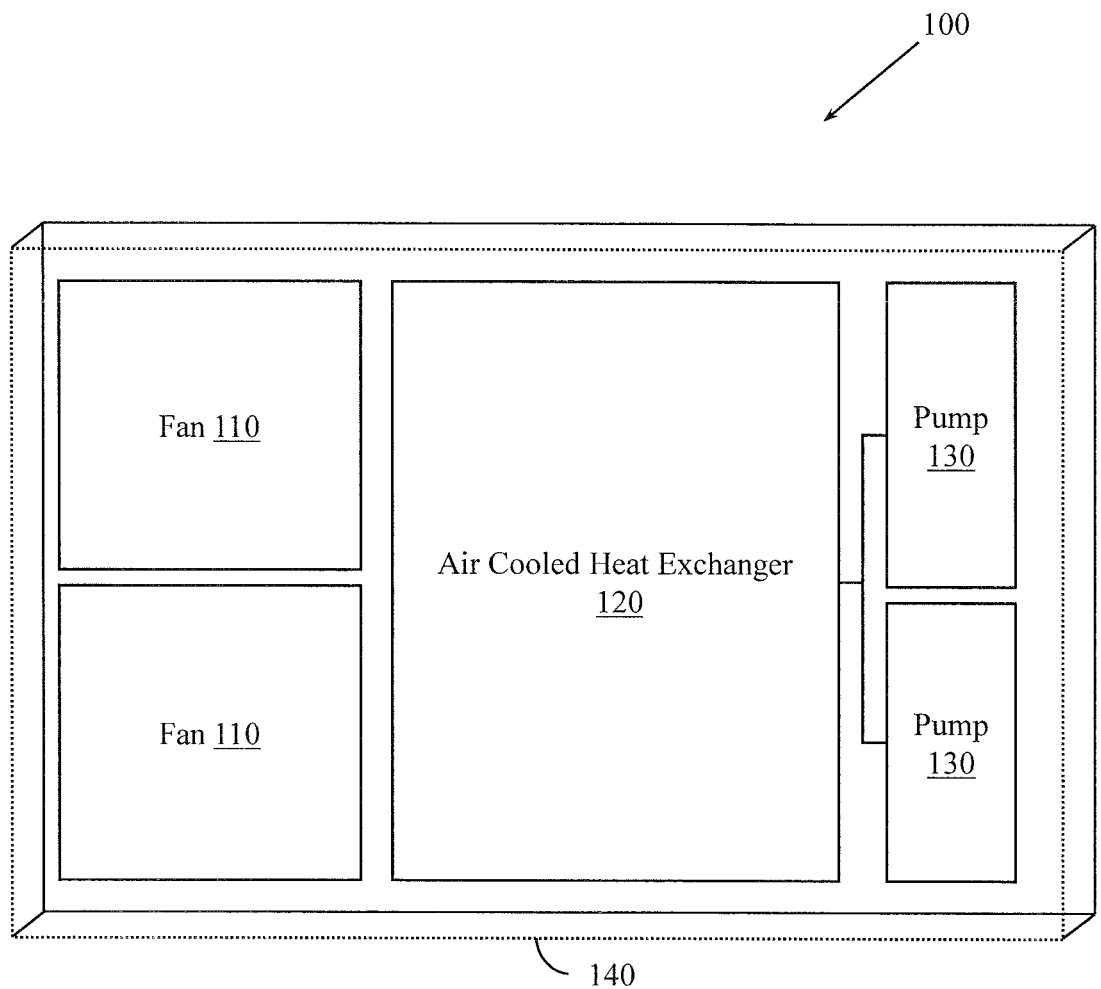
FIG. 1 illustrates an example cooling assist module (CAM).

Example systems described herein relate to moving heat out of a computer (e.g., server) using a cooling assist module (CAM) that circulates a single phase liquid. The example systems may facilitate designing to move heat out of the server to the CAM and dissipating the heat from the CAM rather than designing to dissipate heat in an individualized, piecemeal fashion for each hot item (e.g., processor, integrated circuit) in a computer. In one example, a CAM may be configured as a 1 U form factor rack mountable component to cool a server implemented as a 1 U form factor rack mountable component. The server may be configured to be rack mounted with other servers, computing components, electronic components and so on. In some examples, a CAM may have automated leak detection, cooling control, and failover redundancy. Thus, example systems may provide liquid cooling using a low-pressure, single phase liquid that does not adversely impact server density, that can work with different types of servers, that does not require facilities or rack chilled liquid, that facilitates ad-hoc cooling reconfiguration, and that does not require refrigerant, compressors, rigid piping, and other components associated with two phase high-pressure liquid cooling.

The following includes definitions of selected terms employed herein. The definitions include various examples and/or forms of components that fall within the scope of a term and that may be used for implementation. The examples are not intended to be limiting. Both singular and plural forms of terms may be within the definitions.

A "heat sink" may be, for example, a metal mass that is thermally coupled (e.g., attached) to a heat source and that draws (e.g., accepts) heat energy away from the heat source by conduction. The heat energy may then be dissipated (e.g., rejected) from surfaces of the heat sink into an atmosphere by convection. The convection effect may be enhanced, for example, by a fan. Heat sources and their related heat dissipation requirements may vary widely. Thus, heat sinks may vary widely. Heat sinks may vary in size, material, surface area, fin design, inclusion of a fan, inclusion of a liquid element, and so on.

"Liquid" as used herein refers to a cooling fluid like water, ethanol, ethanol/water mixture, alumina loaded slurries and so on.

A "liquid connection", or a connection by which entities may be in "liquid communication", is one by which a liquid can move to and/or from a first entity to a second entity.

A "detachable connection", or a connection by which entities may be "detachably connected", is one that facilitates attaching and detaching a first entity to a second entity to achieve liquid connection. For example, a hose that is screwed onto a spigot is detachably connected.

A "heat exchanger" is a type of cooling system in which one medium is used to carry heat off another medium. A heat exchanger may be, for example, a liquid to liquid heat exchanger, where a second liquid (e.g., cooling medium) carries heat off a first liquid (e.g., heated medium) without direct contact between the liquids. A heat exchanger may also be, for example, a liquid to air heat exchanger, where air carries heat off a liquid without direct contact between the air and the liquid. In a heat exchanger, the heated medium is generally cooled towards the ambient temperature of the cooling medium.

A "sub-cooling element" is a type of cooling system in which a heat-conveying medium is cooled below the ambient temperature of a surrounding environment. A sub-cooling element may be, for example, a two-phase or refrigeration unit.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like an application specific integrated circuit (ASIC), an analog circuit, a digital circuit, a programmed logic device, a memory device containing instructions, or the like. Logic may include one or more gates, combinations of gates, or other circuit components. In some examples, logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

"Server", as used herein, refers to a computer, typically a higher-end computer that provides some service(s) to other computers.

An "operable connection", or a connection by which entities are "operably connected", is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through intermediate entities like processors, operating systems, a logic, software, and so on. Logical and/or physical communication channels can be used to create an operable connection.

"Signal", as used herein, includes but is not limited to one or more electrical or optical signals, analog or digital signals, data, one or more computer or processor instructions, messages, a bit or bit stream, or other means that can be received, transmitted and/or detected.

U is the standard unit of measure for designating the vertical usable space or height of frames configured to hold computing hardware devices. The frames are typically called racks. The unit of measurement U refers to the space between shelves in a rack. 1 U is typically equal to 1.75 inches. An example 19 inch rack cabinet is defined in the International Electric Commission (IEC) standard with 1 U equaling 44.55 mm.

FIG. 1 illustrates a cooling assist module (CAM) 100. CAM 100 may be configured to facilitate removing heat from a computer (e.g., server), returning the heat to CAM 100 and then rejecting the heat to air moving through CAM 100. Thus, CAM 100 may include an air cooled heat exchanger 120. In other examples, like that described in FIG. 5, a CAM may have a liquid cooled heat exchanger. But for now, returning to CAM 100, the heat exchanger 120 may have a large surface area (e.g., up to one hundred square inches). The larger surface area facilitates improving cooling performance. It is practically impossible to include heat exchangers with such large surface areas in conventional systems. In some examples, like a 1 U form factor CAM, heat exchanger 120 may have as large a surface area as can be fit into the rack mountable unit.

Heat exchanger 120 may be configured to reject heat from a single liquid phase thermally conductive liquid (e.g., water) that is moved between heat exchanger 120, via the pumps 130, to a computer(s) to be cooled. The heat may be rejected from the heat exchanger 120 to ambient air moving through CAM 100 while isolating the liquid from the ambient air. Since the liquid is kept in a single phase throughout operation the path will not include an evaporative path as is found in conventional systems.

Heat exchanger 120 will reject heat from the liquid to the ambient air and thus CAM 100 may include fans 110 that are configured to selectively and controllably move the ambient air in and through CAM 100. The fans 110 may selectively move the ambient air based, for example, on cooling requirements. The fans 110 may be controlled, for example, by logics like those described in FIG. 2. In general, large fans in computing systems produce less noise than smaller fans in computing systems. Thus, in one example, the fans 110 may be very large for a computing system (e.g., at least six inches in diameter) and thus be configured to produce less than 30 dB of noise. In conventional systems, it may be impossible to include such large fans in a standard space, particularly in rack mounted components.

Figure 3:
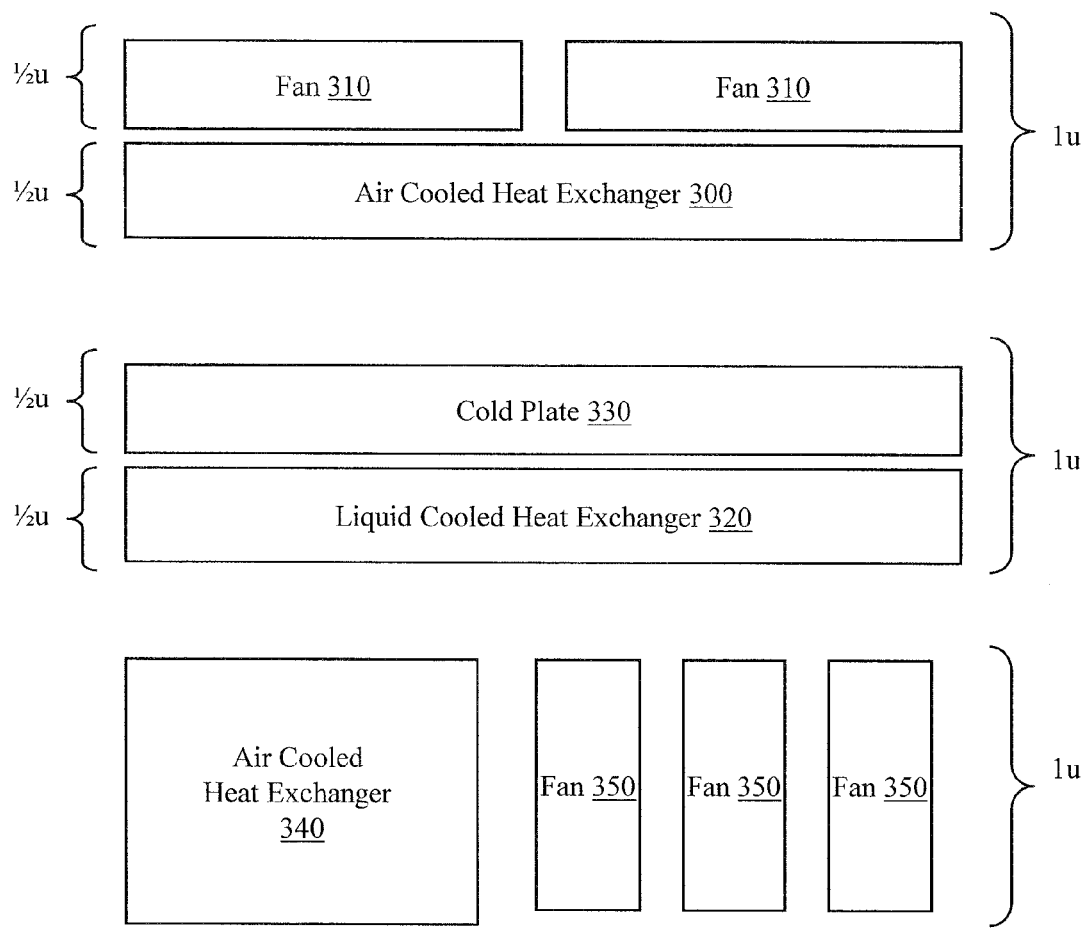
FIG. 3 illustrates various heat exchanger configurations for a 1 U form factor CAM.

Fans 110 may be configured in an automatically redundant arrangement. By way of illustration, if one fan stops working, another fan may be configured to automatically start working and thus continue the flow of ambient air through CAM 100. The automatic redundancy may be achieved through electric techniques, electronic techniques, computer based techniques, and so on. While the fans 110 are illustrated side-by-side in an adjacent configuration in FIG. 1, in other examples the fans 110 may be stacked in front of each other, on top of heat exchanger 120, may bracket heat exchanger 120 and so on. Various arrangements of fans and heat exchangers are illustrated in FIG. 3. While two fans 110 are illustrated in FIG. 1, it is to be appreciated that other example CAMs may have more fans configured in other arrangements. Fans 110 may be hot-swappable with respect to electricity. For example, if one fan has stopped operating, and another fan has automatically started operating, the failed fan may be removed without requiring CAM 100 to be shut down. This facilitates continuous cooling. In a conventional system, if the fan fails, it is likely that the entire system will need to be halted to replace the fan, if the compromised cooling situation is even detected before a system meltdown.

CAM 100 may also include pumps 130 that are configured to selectively and controllably circulate the liquid in a path that includes CAM 100 and a set of computers (e.g., rack mounted servers). The pumps 130 may selectively move the liquid based, for example, on cooling requirements. The pumps 130 may be controlled, for example, by logics like those described in FIG. 2. The liquid removes heat from the computers and returns it to CAM 100. Since CAM 100 uses a liquid that stays in one phase throughout operation it does not include a compressor or an evaporative area. Thus, the liquid may be distributed from CAM 100 at a lower pressure than in conventional refrigerant based systems. In one example, the liquid may be provided at a pressure less than 25 psi. Like the fans 110, the pumps 130 may be configured in an automatically redundant arrangement. Thus, if one pump fails, another pump may automatically start working to facilitate continuously providing liquid to the computer(s) being cooled by CAM 100. Furthermore, pumps 130 may be hot-swappable with respect to both electricity and/or fluid. For example, if one pump fails, and another pump automatically starts, the failed pump may be removed and replaced from CAM 100 without requiring CAM 100 to stop operating. This is an improvement over conventional systems that may require at least the cooling apparatus to be halted, and that more typically requires the entire system being cooled to be halted.

CAM 100 may also include lossless connectors (not illustrated) that are configured to accept liquid conveying apparatus (e.g., flexible tubing) for detachably connecting CAM 100 to computers to be cooled. Rather than requiring the soldering of rigid (e.g., copper pipe), by providing the liquid at a low pressure (e.g., 20 psi), flexible tubing and other more configurable apparatus can be used. This flexible tubing facilitates ad hoc cooling reconfigurations and also facilitates faster addition and/or removal of CAM units from a system. The lossless connectors may be, for example, coaxial connectors. The flexible tubing may be, for example, hose, conduit, bendable pipe, and so on. While flexible tubing is described, it is to be appreciated that rigid pipe (e.g., copper, PVC) could also be used, although with a lessening of dynamic reconfigurability.

CAM 100 may also include a leak containment component 140 that is configured to contain the liquid upon a leak from heat exchanger 120, pumps 130, and so on. In one example, the leak containment component may absorb the leak. In these cases, the leak containment component 140 may be referred to as a "diaper". The diaper may be an intelligent diaper that upon detecting a leak provides a signal to, for example, a leak detection logic (not illustrated). Thus, the leak detection logic may be configured to selectively control the pumps 130 upon detecting a leak. While a diaper is described, it is to be appreciated that other leak containing apparatus may be employed.

Figure 4:
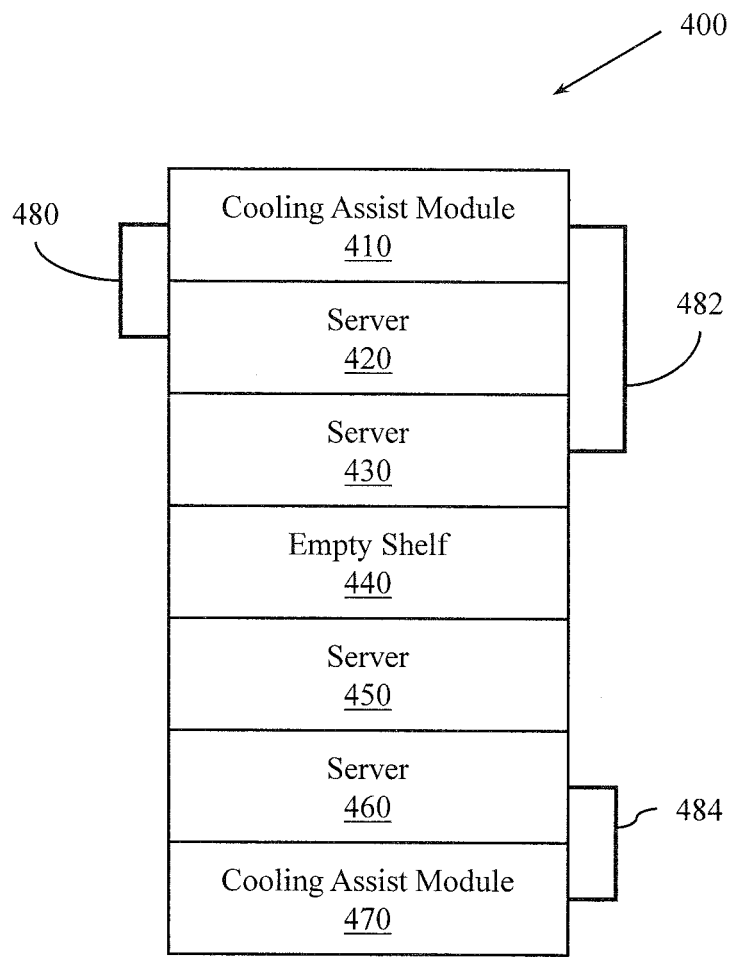
FIG. 4 illustrates an example CAM configured in a rack mounted system.

CAM 100 may take on various sizes and shapes. In one example, CAM 100 may have a 1 U form factor and be rack mountable. An example of this configuration is illustrated in FIG. 4. When CAM 100 takes on this form factor, it may also be hot swappable out of the rack with respect to electricity and fluid. Thus, other components (e.g., rack mounted servers) in the system may continue operation while CAM 100 is replaced. While a rack mounted 1U form factor is described, it is to be appreciated that CAM 100 may have other sizes and shapes like a desktop model, a floor mounted "tower" model, and so on. Additionally, CAM 100 may be configured to satisfy various cooling demands. In one example, CAM 100, through its heat exchanger, fans, and pumps may be configured to cool a computer with components producing more than 250 watts/cm$^2$. It is to be appreciated that other CAMs may be configured to provide other cooling amounts.

Figure 2:
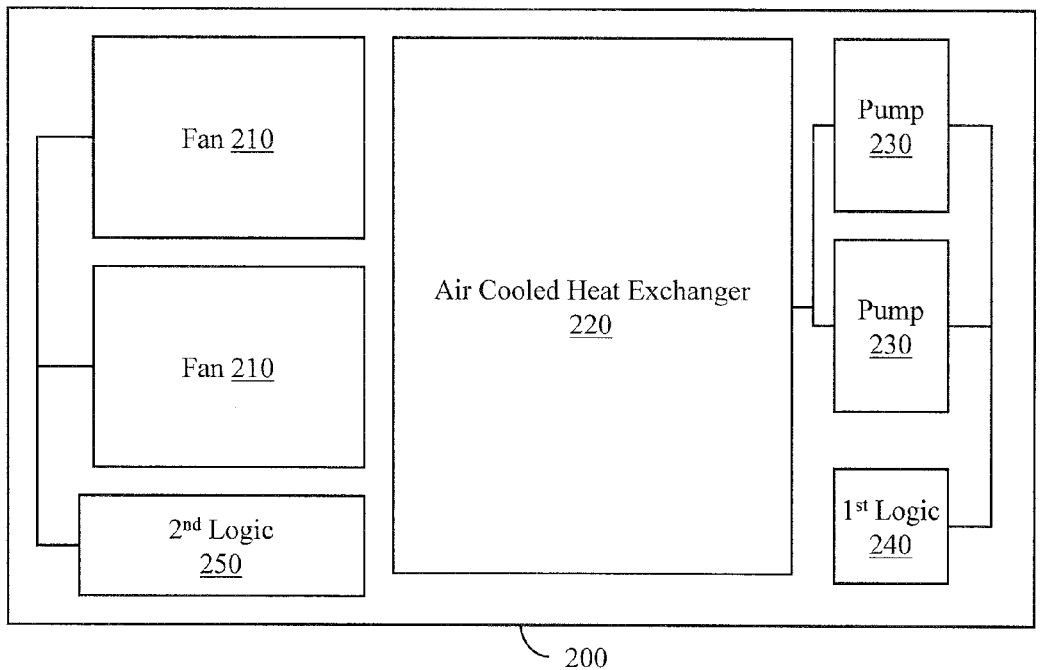
FIG. 2 illustrates another example CAM.

FIG. 2 illustrates a CAM 200 that includes logics like those discussed in connection with FIG. 1. Like CAM 100, CAM 200 includes redundant fans 210, an air-cooled heat exchanger 220, and redundant pumps 230. Additionally, CAM 200 includes a first logic 240 that is configured to monitor the liquid flow in, into, and/or out of CAM 200 and to selectively control the liquid flow in, into, and/or out of CAM 200. First logic 240 may also monitor the temperature of the fluid. Monitoring and controlling the liquid flow(s) or temperature facilitates, for example, controlling how loud CAM 200 is, how much power CAM 200 consumes, the heat transfer rate and thus the cooling capacity of CAM 200, and so on. The noise level may depend, for example, on pump noise. Similarly, the power consumption may depend, for example, on pumping volume. Thus, monitoring and selectively controlling the liquid flow(s) and temperature improves CAM 200 over conventional single speed, single capacity systems.

To illustrate how the logic(s) make CAM 200 "intelligent", consider that at a first time, CAM 200 may be tasked with cooling a server whose components produce approximately 100 Watts/cm$^2$. By monitoring the liquid flow(s) and temperature, an appropriate number of pumps 230 (e.g., one pump) may circulate a first volume of the liquid between CAM 200 and the server at a first rate. This may facilitate lowering power consumption, reducing noise, and tailoring the amount of heat transfer provided. At a second point in time, CAM 200 may be tasked with cooling a different server that produces approximately 250 Watts/cm$^2$. By monitoring the liquid flow(s) and temperature, an appropriate number of pumps 230 (e.g., two pumps) may circulate a second volume of the liquid between CAM 200 and the server at a second rate. This illustrates that CAM 200 can be, at least in part, a self-configuring or "intelligent" cooling assist module that reacts to its environment without user intervention.

CAM 200 may also include a second logic 250 that is configured to monitor the temperature of the ambient air in CAM 200. The second logic 250 may also monitor the flow of ambient air in CAM 200. Based on the air temperature and/or air flow, the second logic 250 may selectively control fans 210 to move more or less air through CAM 200. This facilitates controlling, for example, how much noise CAM 200 produces, how much power CAM 200 consumes, the heat transfer rate for CAM 200 and so on. For example, the noise produced and the power consumed may depend on how many fans are operating and how fast they are turning. Like the first logic 240 that controls the pumps 230, the second logic 250 controls the fans 210 to allow CAM 200 to be intelligent and self-configuring. While separate logics 240 and 250 are illustrated, it is to be appreciated that in another example a single logic may perform both these functions. Also, in another example, a larger number of logics, (e.g., one logic per pump, one per fan) may be employed.

CAM 200 may also include the third logic described in association with FIG. 1. The third logic (not illustrated) may be configured to detect a leak in a portion of the path traveled by the liquid and to selectively isolate the portion of the path with respect to fluid flow. For example, the third logic may control a servo(s) that manipulates a gate(s) that can close off a portion of a liquid path. The third logic may, for example, receive a signal from a leak detection apparatus and respond to the signal by selectively closing a gate or set of gates. In another example, the third logic may control a vacuum pump (not illustrated) configured to suck liquid out of a portion of a path and to prevent fluid from re-entering the portion until further control is exercised. While gates and vacuums are described, it is to be appreciated that other isolation techniques may be employed.

FIG. 3 illustrates side views of various heat exchanger configurations for a 1 U form factor cooling assist module. For example, air cooled heat exchanger 300 may be arranged in a stack configuration with fans 310. In the example, heat exchanger 300 is approximately ½ U in height while fans 310 are also about ½ U in height. Thus, the total height of the stack is about 1 U and would fit in a 1 U form factor component. It is to be appreciated that fans 310 and heat exchanger 300 could have larger or smaller dimensions in other stack examples. Furthermore, while heat exchanger 300 and other heat exchangers are illustrated as being substantially flat and rectangular, other heat exchanger shapes like oval designs, hexagonal designs, finned designs, radiator like designs, and so on, may be employed.

Liquid cooled heat exchanger 320 is illustrated in a stack configuration with cold plate 330. Once again, each component consumes about ½ U of height and thus the combination may be placed in a 1 U form factor component. Again, it is to be appreciated that heat exchanger 320 and cold plate 330 could have different dimensions in different examples. For example, heat exchanger 320 and cold plate 330 could be configured to fit in a 2 U form factor component.

Air cooled heat exchanger 340 is illustrated in a side-by-side adjacent configuration with fans 350. Heat exchanger 340 is illustrated being less than 1 U in height and fans 350 are also less than 1 U in height. Thus, heat exchanger 340 and fans 350 could fit into a 1 U form factor component. However, it is to be appreciated that other adjacent configurations could have different dimensions.

In one example, heat exchanger 300 may have a surface area of at least 128 square inches and be arranged with fans 310 in a stack configuration. In another example, fans 310 may be at least eight inches in diameter, less than 1 U in height, and produce less than 30 db of sound. In another example, heat exchanger 340 may have a surface area of at least 80 square inches, may be less than 1 U in height, and be arranged with fans 350 in an adjacent (side-by-side) configuration. It is to be appreciated that being "adjacent" does not require the components to be touching. While example fans having diameters of eight inches or six inches are provided, and while example heat exchangers having surface areas of 80 square inches and 128 square inches are provided, it is to be appreciated that smaller fans and smaller heat exchangers may be employed.

FIG. 4 illustrates a rack mounted computer system 400. System 400 includes a first CAM 410 positioned on a top shelf on the rack and a second CAM 470 positioned on the bottom shelf of the rack. While two CAMs are illustrated, it is to be appreciated that system 400 may include a greater and/or lesser number of CAMs positioned on different shelves. CAM 410 and CAM 470 may be, for example, CAMs like those described in connection with FIGS. 1, 2, and 5. Thus, CAM 410 and CAM 470 are configured to provide a liquid employed in liquid cooling computers and/or computer components. The elements to be liquid cooled may be, for example, servers 420, 430, and 460. Note that system 400 may also include a server 450 that is not liquid cooled and may be housed in a rack having an empty shelf 440. Thus FIG. 4 conveys that CAMs can be used in configurable systems and may facilitate dynamic reconfiguration of those systems. By way of illustration, a higher capacity server may replace server 450 and thus an additional CAM may be added to empty shelf 440. By way of further illustration, an additional server may be placed on empty shelf 440 and CAM 470 may be placed in liquid communication with the new server.

Thus, system 400 may include a server(s) positioned on a shelf on the rack, the server being configured to receive the liquid and to transfer heat from the server into the liquid. In one example, the server may be a generic server that simply has a PCI slot available into which a PCI plug in card that receives the liquid can be plugged.

System 400 also illustrates hoses 480, 482, and 484 that are configured to transfer the liquid from a CAM to a server(s). Since the CAMs use a liquid that stays in a single phase, the liquid can be circulated at a low pressure (e.g., <35 psi). While CAM 410 is connected to server 420 by hose 480 and to server 430 by hose 482, it is to be appreciated that the liquid may take different paths and that different hose, conduit, pipe, and so on connections and routings may be employed. For example, liquid may flow from CAM 410 to server 420 and back and also from CAM 410 to server 430 and back. In another example, server 420 could be brought into liquid communication with server 430 and the liquid may travel from CAM 410 to server 420 to server 430 and then back to CAM 410.

To facilitate making dynamically configurable liquid paths, system 400 may include a set of lossless connections (not illustrated) that are configured to facilitate detachably connecting the liquid conveying apparatus (e.g., hoses) to CAMs and servers. The lossless connections may be, for example, coaxial connectors, screw on connectors, diaphragm based connectors, male/female pressure control connectors, blindmate hot pug connectors, and so on.

In one example, CAM 410 may be a 1 U form factor rack mountable CAM that is configured to facilitate removing more than 250 watts/cm$^2$ of heat from server 420 and to remove more than 125 watts/cm$^2$ from server 430. CAM 410 may be configured to facilitate returning the heat to CAM 410 and rejecting the heat to ambient air moving in CAM 410. Thus, CAM 410 may include an air cooled heat exchanger (not illustrated) having a surface area of at least 128 square inches and being configured to reject heat from a single liquid phase thermally conductive liquid to the ambient air moving in CAM 410 while isolating the liquid from the ambient air.

CAM 410 may also include hot swappable fans configured to selectively and controllably move the ambient air in CAM 410, the fans being at least six inches in diameter and producing less than 30 dB of sound. The fans may also be configured in an automatically redundant arrangement. Similarly, CAM 410 may include hot swappable pumps that are configured to selectively and controllably circulate the liquid in a path including CAM 410 and servers 420 and 430. The pumps may be arranged in an automatically redundant configuration.

Cam 410 may also include lossless connectors that are configured to accept liquid conveying apparatus like flexible tubing for detachably connecting CAM 410 to servers 420 and 430, the liquid being provided to the conveying apparatus at a pressure of less than 25 psi. CAM 410 may also include a leak containment component configured to absorb the liquid upon a leak from the heat exchanger or the pumps.

CAM 410 may be an intelligent cooling apparatus. Thus CAM 410 may include a first logic that is configured to monitor a liquid flow and/or liquid temperature and to selectively control the liquid flow to facilitate controlling CAM 410 noise, CAM 410 power consumption, CAM 410 heat transfer rate, and so on. Similarly, CAM 410 may include a second logic that is configured to monitor an air temperature and/or an air flow in CAM 410. The second logic may selectively control the fans to facilitate controlling CAM 410 noise, CAM 410 power consumption, CAM 410 heat transfer rate, and so on. Additionally, CAM 410 may include a third logic that is configured to detect a leak in a portion of the path and to selectively isolate the portion of the path with respect to fluid flow. Thus, if CAM 410 leaks, it may not drip into server 420 or other components in system 400. It is to be appreciated that system 400 is but one example system configured with cooling assist modules and that other configurations are possible.

Figure 5:
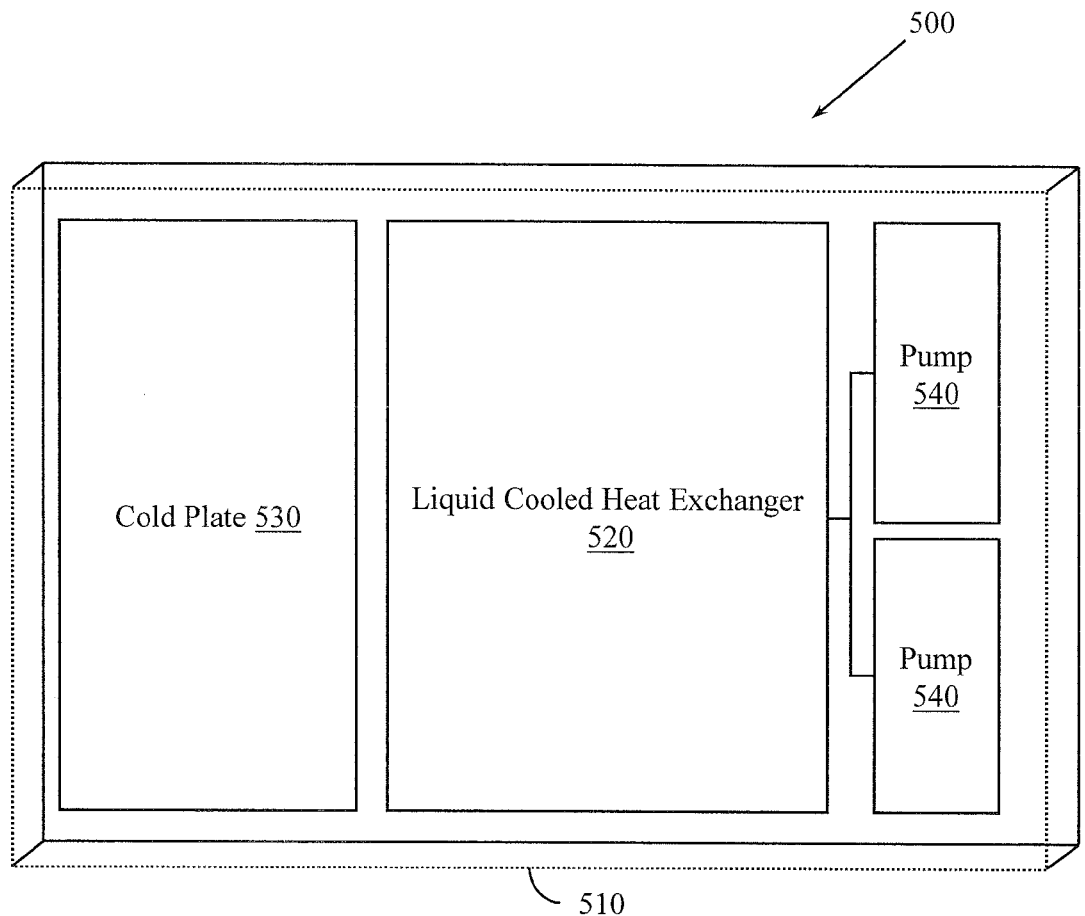
FIG. 5 illustrates an example CAM.

FIG. 5 illustrates a CAM 500 with a liquid cooled heat exchanger 520. CAM 500 is configured to facilitate removing heat from a computer, returning the heat to CAM 500, and rejecting the heat from CAM 500 into a cold plate 530. Cold plate 530 may be provided with facilities chilled fluid, with fluid from a conventional rack with built in fluid transportation, and so on. In one example, heat exchanger 520 may have a surface area of at least eighty square inches and be configured to reject heat from a liquid into cold plate 530. In the example, cold plate 530 may also have a surface area of at least eighty square inches and be configured to circulate externally cooled fluid into which the heat rejected from the liquid in heat exchanger 520 can be accepted.

CAM 500 may also include redundant, hot swappable pumps 540 that are configured to selectively and controllably circulate the liquid in a path including CAM 500 and a set of computers. The liquid removes heat from the set of computers and returns it to CAM 500. Thus, CAM 500 may also include a set of connectors (e.g., lossless connectors) that are configured to accept liquid conveying apparatus (e.g., flexible tubing) for detachably connecting CAM 500 to the set of computers. Like the other single phase CAMS described herein, CAM 500 may provide the liquid to the tubing and thus to the set of computers at a low pressure (e.g., <15 psi).

To prevent damage from leaks, CAM 500 may include a leak containment component 510 that is configured to contain (e.g., absorb) the liquid in heat exchanger 520 and/or cold plate 530. In another example, the leak containment component may not absorb the liquid but may simply restrict its movement.

Like CAMs that include air-cooled heat exchangers, CAM 500 may also be an intelligent cooling apparatus. Thus, CAM 500 may include a first logic that is configured to monitor a liquid flow and/or temperature and to selectively control pumps 540 to control the liquid flow to facilitate controlling things like how much sound CAM 500 produces, how much power CAM 500 consumes, a heat transfer rate for CAM 500, and so on. Similarly, CAM 500 may include another logic configured to detect and/or respond to leaks. For example, the logic may control pumps 540 to stop pumping if a leak is detected. Similarly, the logic may control various mechanical apparatus (e.g., servo, gate, vacuum pump) to isolate a section of a path so that no more liquid can flow through that path until further control is exercised (e.g., gate opened, vacuum dissipated).

While heat exchanger 520 and cold plate 530 are illustrated side-by-side in an adjacent configuration, other arrangements like those illustrated in FIG. 4 are possible. For example, heat exchanger 520 and cold plate 530 may be configured in arrangements like a stack, interleaved fins, and so on. Additionally, heat exchanger 520 and cold plate 530 may have dimensions that facilitate fitting CAM 500 into a 1 U form factor component, a 2 U form factor component, and so on.

Figure 6:
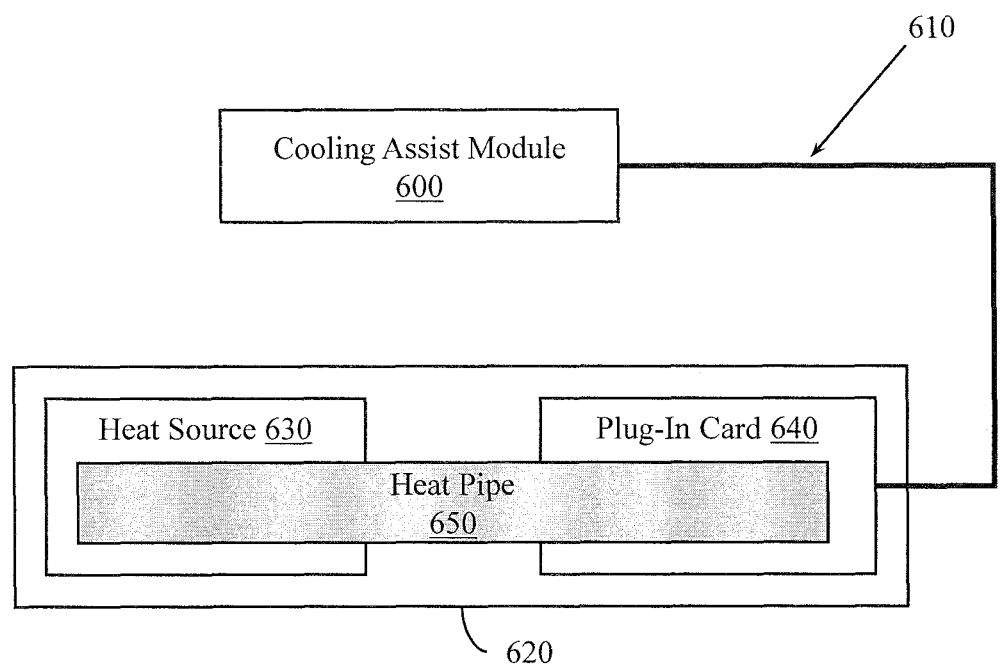
FIG. 6 illustrates an example computer cooled, at least in part, by a CAM.

FIG. 6 illustrates a CAM 600 connected by flexible hose 610 to a plug in card 640 in a computer 620. CAM 600 may be configured to be in liquid communication with plug in card 640. Computer 620 may be configured with plug in card slots (e.g., PCI slots). Furthermore, computer 620 may be configured with a heat relocation device like heat pipe 650 that extends from a heat source 630 in computer 620 to a region associated with the plug in slots. In the region associated with the plug in slots, heat from heat pipe 650 may be transferred to liquid in plug in card 640. Thus, unlike conventional systems where liquid from a two phase cooling system is provided to a cold plate that must be soldered or otherwise attached to heat source 630, CAM 600 facilitates providing liquid cooling to computer 620 without reconfiguring computer 620. Furthermore, if a liquid barrier exists between the plug in card region and heat source 630 (e.g., processor, integrated circuit), then liquid cooling may be provided without introducing liquid into the processor area of the computer. This removes a barrier to entry for accepting liquid cooling. While a heat pipe is described as the heat relocation device, it is to be appreciated that other heat relocation devices like a heat sink, a cold plate, and so on may be employed.

While example systems have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A cooling assist module (CAM) configured to remove heat from a computer, return the heat to the CAM, and reject the heat to air in the CAM, comprising:

an air cooled heat exchanger having a surface area configured to reject heat from a single liquid phase thermally conductive liquid to ambient air in the CAM;

two or more fans configured in an automatically redundant arrangement wherein at least a second fan is configured to automatically start operating upon at least a first fan ceasing to operate to selectively and controllably move the air through the CAM;

two or more pumps configured in an automatically redundant arrangement wherein at least a second pump is configured to automatically start operating upon at least a first pump ceasing to operate to selectively and controllably circulate the liquid in a path including the CAM and one or more computers, the liquid being provided at less than 25 psi;

one or more lossless connectors configured to accept a conveying apparatus for detachably connecting the CAM to the computers;

a leak containment component configured to contain the liquid upon a leak from the heat exchanger or the pumps;

logic configured to monitor the fans based on air temperature and flow and selectively control the fans to facilitate controlling one or a combination of CAM noise, CAM power consumption, and CAM heat transfer rate; and the CAM being in liquid communication with a plug in card, the plug in card being configured to plug into the computer configured with one or more plug in slots, the CAM being external to the computer, the computer being configured with a heat relocation device that extends from a heat source in the server to a region associated with the plug in slots wherein a portion of the heat relocation device in the region associated with the plug in slots will be cooled by the plug in card.

2. A cooling assist module (CAM) configured to remove heat from a computer, return the heat to the CAM, and reject the heat to air in the CAM, comprising:

an air cooled heat exchanger having a surface area configured to reject heat from a single liquid phase thermally conductive liquid to the ambient air in the CAM;

two or more fans configured in an automatically redundant arrangement wherein at least a second fan is configured to automatically start operating upon at least a first fan ceasing to operate to selectively and controllably move the air through the CAM;

two or more pumps configured in an automatically redundant arrangement wherein at least a second pump is configured to automatically start operating upon at least a first pump ceasing to operate to selectively and controllably circulate the liquid in a path including the CAM and one or more computers;

one or more lossless connectors configured to accept a conveying apparatus for detachably connecting the CAM to the computers;

a leak containment component configured to contain the liquid upon a leak from the heat exchanger or the pumps; and the CAM being in liquid communication with a plug in card, the plug in card being configured to plug into the computer configured with one or more plug in slots, the CAM being external to the computer, the computer being configured with a heat relocation device that extends from a heat source in the computer to a region associated with the plug in slots wherein a portion of the heat relocation device in the region associated with the plug in slots will be cooled by the plug in card.

3. The CAM of claim 2, including a first logic configured to monitor a liquid flow, or a liquid temperature, or both, and the first logic being further configured to selectively control the pumps to facilitate controlling CAM noise, or CAM power consumption, or CAM heat transfer rate, or combinations thereof.

4. The CAM of claim 3, including a second logic configured to monitor an ambient air temperature, or an ambient air flow, or both, and the second logic being further configured to selectively control the fans to facilitate controlling CAM noise, or CAM power consumption, or CAM heat transfer rate, or combinations thereof.

5. The CAM of claim 2, the fans being configured to produce less than 30 dB of sound and the liquid being provided at less than 25 psi.

6. The CAM of claim 5, the fans and the heat exchanger being arranged in a stack configuration.

7. The CAM of claim 2, the fans being at least five inches in diameter, less than 1 U in height, and producing less than 30 db of sound, the heat exchanger having a surface area of at least 128 square inches and being less than 1 U in height, the fans and the heat exchanger being arranged in an adjacent configuration.

8. The CAM of claim 2, the fans and the pumps being hot swappable.

9. The CAM of claim 4, including a third logic configured to detect a leak in a portion of the path and to selectively isolate the portion of the path with respect to liquid flow.

10. The CAM of claim 2 having a 1 U form factor and being rack mountable.

11. The CAM of claim 10, the CAM being hot swappable in a rack with respect to electricity and fluid.

12. The CAM of claim 2, the heat exchanger, fans, and pumps being configured to cool a computer whose components produce more than 250 watts/cm$^2$.

13. The CAM of claim 2, wherein a liquid barrier is configured between the region associated with the plug in slots and the heat source.

14. A 1 U form factor rack mountable cooling assist module (CAM) configured to facilitate removing more than 250 watts/cm$^2$ of heat from components in a server, returning the heat to the CAM, and rejecting the heat to ambient air moving in the CAM, comprising:

an air cooled heat exchanger having a surface area configured to reject heat from a single liquid phase thermally conductive liquid to the ambient air moving through the CAM while isolating the liquid from the ambient air;

two or more hot swappable fans configured to selectively and controllably move the ambient air in the CAM, the fans producing less than 30 dB of sound, the fans being configured in an automatically redundant arrangement wherein at least a second fan is configured to automatically start operating upon at least a first fan ceasing to operate;

two or more hot swappable pumps configured to selectively and controllably circulate the liquid in a path including the CAM and one or more servers, the liquid being configured to remove heat from the servers and to return the heat to the CAM and for circulating the liquid through the flexible tubing at a pressure of less than twenty-five pounds per square inch, the pumps being arranged in an automatically redundant configuration wherein at least a second pump is configured to automatically start operating upon at least a first pump ceasing to operate;

one or more lossless connectors configured to accept flexible tubing for detachably connecting the CAM to the servers;

a leak containment component configured to contain the liquid upon a leak from the heat exchanger or the pumps;
a first logic configured to monitor a liquid flow and temperature, and configured to selectively control the pumps to facilitate controlling one or combinations of, CAM noise, CAM power consumption, and CAM heat transfer rate;
a second logic configured to monitor an ambient air temperature and an ambient air flow, and configured to selectively control the fans to facilitate controlling one or combinations of, CAM noise, CAM power consumption, and CAM heat transfer rate;
a third logic configured to detect a leak in a portion of the path and to selectively isolate the portion of the path with respect to liquid flow; and
the CAM is configured for mounting in a rack shelf external to the one or more servers and is configured to connect to and circulate the liquid to a plug-in card plugged into one of the servers.

15. A system, comprising:
means for exchanging heat from a component in a server to a plug-in card connected to a slot in the server, the server being mounted in a rack within a 1 U form factor, and the plug-in card including a liquid path for carrying a liquid;
means for circulating the liquid between the plug-in card in the server and a 1 U form factor cooling assist module positioned external to the server;
means for exchanging heat out of the liquid in the cooling assist module;
means for rejecting the heat from the cooling assist module;
means for selectively controlling the circulating of the liquid, where at no time during system operation does the liquid exert more than 35 psi and where the liquid is in a single phase at all times during system operation; and
means for containing a leak in the cooling assist module, wherein the system is configured to cool a computer whose components produce more than 250 watts/cm$^2$ of heat.

16. A method of removing heat from a computer, comprising:
providing a cooling assist module (CAM) configured to be in liquid communication with a component of the computer, the CAM comprising:
a heat exchanger having a surface area configured to reject heat from a single liquid phase thermally conductive liquid;
two or more fans configured in an automatically redundant arrangement wherein at least a second fan is configured to automatically start operating upon at least a first fan ceasing to operate to selectively and controllably move the air through the CAM;
two or more pumps configured in an automatically redundant arrangement wherein at least a second pump is configured to automatically start operating upon at least a first pump ceasing to operate to selectively and controllably circulate the liquid in a path including the CAM and the computer;
one or more lossless connectors configured to accept a conveying apparatus for detachably connecting the CAM to the computer;
a leak containment component configured to contain the liquid upon a leak from the heat exchanger or the pumps; and
the CAM being in liquid communication with a plug in card, the plug in card being configured to plug into the computer configured with one or more plug in slots, the CAM being external to the computer, the computer being configured with a heat relocation device that extends from a heat source in the computer to a region associated with the plug in slots wherein a portion of the heat relocation device in the region associated with the plug in slots will be cooled by the plug in card;
controlling the CAM to move the liquid between the CAM and the computer;
controlling the fans based on air temperature and flow to facilitate controlling one or a combination of CAM noise, CAM power consumption, and CAM heat transfer rate;
circulating the liquid through the path at a pressure less than 25 psi; and
rejecting the heat from the CAM.

* * * * *